(12) United States Patent
Lee et al.

(10) Patent No.: US 12,463,626 B2
(45) Date of Patent: Nov. 4, 2025

(54) CLOCK PHASE CONVERTER AND PHASE CONVERTING METHOD

(71) Applicant: LX SEMICON CO., LTD., Daejeon (KR)

(72) Inventors: Jong Suk Lee, Daejeon (KR); Seok Jae Oh, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 11 days.

(21) Appl. No.: 18/538,515

(22) Filed: Dec. 13, 2023

(65) Prior Publication Data

US 2024/0195398 A1 Jun. 13, 2024

(30) Foreign Application Priority Data

Dec. 13, 2022 (KR) .................. 10-2022-0173361
Jan. 9, 2023 (KR) .................. 10-2023-0002805
Jan. 9, 2023 (KR) .................. 10-2023-0002806
Jan. 11, 2023 (KR) .................. 10-2023-0003864
Dec. 8, 2023 (KR) .................. 10-2023-0177845

(51) Int. Cl.
| | |
|---|---|
| H03K 5/135 | (2006.01) |
| H03K 3/037 | (2006.01) |
| H03K 17/00 | (2006.01) |
| H03K 19/21 | (2006.01) |
| H03K 5/00 | (2006.01) |

(52) U.S. Cl.
CPC ............. *H03K 5/135* (2013.01); *H03K 3/037* (2013.01); *H03K 17/005* (2013.01); *H03K 19/21* (2013.01); *H03K 2005/00078* (2013.01); *H03K 2005/00234* (2013.01); *H03K 2005/00286* (2013.01)

(58) Field of Classification Search
CPC ...... H03K 5/135; H03K 3/037; H03K 17/005; H03K 19/21; H03K 2005/00078; H03K 2005/00234; H03K 2005/00286
See application file for complete search history.

(56) References Cited

U.S. PATENT DOCUMENTS 7,616,708 B2 * 11/2009 Chen .................. H04L 7/0337
375/360

* cited by examiner

*Primary Examiner* — Cassandra F Cox
(74) *Attorney, Agent, or Firm* — ROTHWELL, FIGG, ERNST & MANBECK, P.C.

(57) ABSTRACT

Disclosed are a clock phase converter and a phase converting method that can generate a converted clock signal with a desired amount of delay by selecting and outputting an output signal corresponding to a preset value among output signals of a plurality of delayed clock signal generators that detect the transition of a clock signal and generate delayed clock signals by sequentially delaying the clock signal by a certain period of time.

13 Claims, 12 Drawing Sheets

CLOCK PHASE CONVERTER AND PHASE CONVERTING METHOD

CROSS-REFERENCE TO RELATED APPLICATIONS

This application claims the benefit of Korean Patent Application Nos. 10-2022-0173361, filed on Dec. 13, 2022, 10-2023-0002805, filed on Jan. 9, 2023, 10-2023-0002806, filed on Jan. 9, 2023, 10-2023-0003864, filed on Jan. 11, 2023, and 10-2023-0177845, filed on Dec. 8, 2023, all of which are hereby incorporated by reference in their entirety as if fully set forth herein

BACKGROUND

1. Technical Field

The present disclosure relates to a clock phase converter, and particularly, to a clock phase converter and a phase converting method that can convert the phase of a clock with a desired resolution and also convert the frequency of the clock.

2. Related Art

Digital clock signals used in operations of a plurality of functional blocks included in information and communication devices (hereinafter, referred to as IT devices) are generated by converting a master clock signal with a specific frequency into various frequencies and various phases.

In general, a clock phase converter generates a converted clock signal by inverting the phase of a clock signal to be converted or delaying the clock signal for a certain period of time.

FIG. 1 illustrates an example of a clock phase converter 100 in the related art.

Referring to FIG. 1, the clock phase converter 100 in the related art generates an inverse clock signal CLK_B by inverting a clock signal CLK by using an inverter INV and a D-type flip-flop D_FF. Since an output signal INV_180 of the inverter INV, which inverts the phase of the clock signal CLK, is used as a clock signal of the D-type flip-flop D_FF, the D-type flip-flop D_FF repeats an operation of transferring the clock signal CLK applied to an input terminal D thereof to an output terminal Q thereof and an operation of holding the clock signal CLK for a certain period of time whenever the output signal INV_180 of the inverter INV transitions. Referring to FIG. 1, it can be seen that the D-type flip-flop D_FF generates the signal CLK_B by inverting the clock signal CLK whenever the output signal INV_180 of the inverter INV transitions.

FIG. 2 is another example of a clock phase converter in the related art.

Referring to FIG. 2, one example of a clock phase converter in the related art is an inverter array configured by connecting a plurality of inverters INV in series. When a clock signal CLK is applied to an input terminal (left side in FIG. 2) of the inverter array, the inverter array may generate a converted clock signal CLK_N from an output terminal of the last inverter INV (rightmost inverter) of the inverter array. In such a case, the phase of the converted clock signal CLK_N has a value delayed by the total response delay time Td of the plurality of inverters INV constituting the inverter array.

When an even number of inverters INV is included in the inverter array, a converted clock CLK_N with only a changed phase may be generated, but when an odd number of inverters INV are included, the phase of the converted clock CLK_N may also be inverted.

Although the phase delay time may be adjusted depending on the number of inverters, there is a disadvantage that an area of a semiconductor circuit increases as the number of inverters increases. When the number of inverters increases, a generated converted clock signal may exceed one cycle of the clock signal CLK.

SUMMARY

Various embodiments are directed to providing a clock phase converter that can generate a converted clock signal with a desired amount of delay by selecting and outputting an output signal corresponding to a preset value among output signals of a plurality of delayed clock signal generators that detect the transition of a clock signal and generate delayed clock signals by sequentially delaying the clock signal by a certain period of time.

Various embodiments are directed to providing a phase converting method that can generate a converted clock signal with a desired amount of delay by selecting and outputting an output signal corresponding to a preset value among output signals of a plurality of delayed clock signal generators that detect the transition of a clock signal and generate delayed clock signals by sequentially delaying the clock signal by a certain period of time.

Technical problems to be achieved in the present disclosure are not limited to the aforementioned technical problems and the other unmentioned technical problems will be clearly understood by those skilled in the art from the following description.

A clock phase converter according to the present disclosure includes: a delayed clock signal generation unit configured to generate a plurality of delayed clock signals by converting a phase of a clock signal or the phase and a frequency of the clock signal; a delayed clock signal storage unit configured to receive, store, and output the clock signal in response to a corresponding delayed clock signal among the plurality of delayed clock signals; a delayed clock signal first logic combination unit configured to generate a plurality of exclusive OR signals by performing EXclusive ORing on a logic high signal and a plurality of storage clock signals stored in the delayed clock signal storage unit; an encoder configured to generate an encoding output signal by counting logic states of the plurality of exclusive OR signals; a divider configured to output, as a selection signal, a value obtained by dividing a preset divide value by the encoding output signal; and a multiplexer configured to output a selected delayed clock signal selected in response to the selected signal among the plurality of delayed clock signals.

A phase converting method according to an aspect of the present disclosure is performed by a clock phase converter including a delayed clock signal generation unit that generates a plurality of delayed clock signals by converting a phase of a clock signal or the phase and a frequency of the clock signal, and includes: a step of detecting the edge of the clock signal; a step of generating a plurality of delayed clock signals sequentially delayed by using a preset delay time; a step of encoding the number of states selected from states of the plurality of delayed clock signals; a step of generating, as a selection signal, a value (quotient) obtained by dividing an encoded value by a preset divide value; and a step of selecting and outputting a delayed clock signal corresponding to the selection signal among the plurality of delayed clock signals.

A phase converting method according to another embodiment of the present disclosure is performed by a clock phase converter including a delayed clock signal generation unit that generates a plurality of delayed clock signals by converting a phase of a clock signal or the phase and a frequency of the clock signal, is able to convert a phase and a frequency of a delayed clock signal generated, and includes: a step of selecting a path; a step of generating a plurality of A-path delayed clock signals sequentially delayed by using a preset delay time in correspondence to 0° to 180° of the clock signal CLK when a path A is selected in the step of selecting a path; a step of generating a plurality of B-path delayed clock signals sequentially delayed by using a preset delay time in correspondence to 180° to 360° of the clock signal CLK when a path B is selected in the step of selecting a path; a step of encoding the number of states selected from states of the plurality of A-path delayed clock signals and the plurality of B-path delayed clock signals; a step of generating, as a selection signal, a value (quotient) obtained by dividing an encoded value by a preset divide value; and a step of selecting and outputting a delayed clock signal corresponding to the selection signal among the plurality of A-path delayed clock signals and the plurality of B-path delayed clock signals.

Technical problems to be achieved in the present disclosure are not limited to the aforementioned technical problems and the other unmentioned technical problems will be clearly understood by those skilled in the art from the following description.

A clock phase converter and a phase converting method according to the present disclosure as described above can generate a converted clock signal with a desired amount of delay by selecting and outputting an output signal corresponding to a preset value among output signals of a plurality of delayed clock signal generators that detect the transition of a clock signal and generate delayed clock signals by sequentially delaying the clock signal by a certain period of time, thereby providing the advantage of being able to adjust the phase and frequency of a signal generated.

Effects achievable in the disclosure are not limited to the aforementioned effects and the other unmentioned effects will be clearly understood by those skilled in the art from the following description.

DETAILED DESCRIPTION

Figure 1:
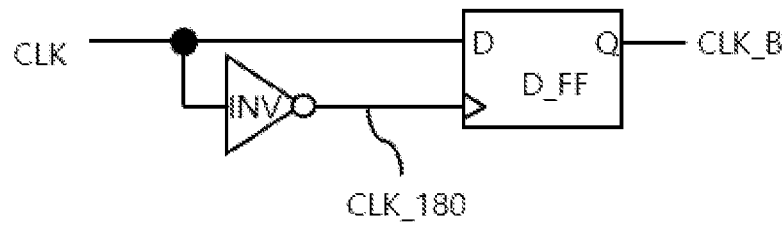
FIG. 1 illustrates an example of a clock phase converter in the related art.
Figure 2:
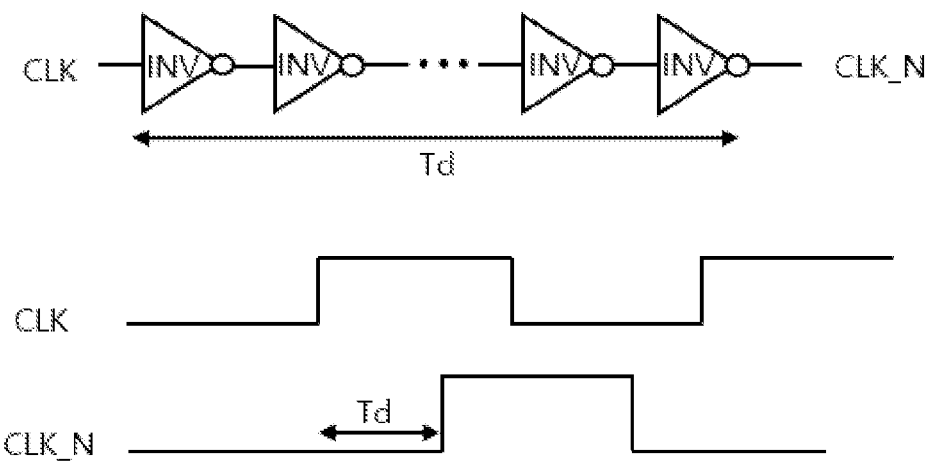
FIG. 2 is another example of a clock phase converter in the related art.

In order to fully understand the present disclosure, advantages in operation of the present disclosure, and objects achieved by carrying out the present disclosure, the accompanying drawings for explaining exemplary examples of the present disclosure and the contents described with reference to the accompanying drawings need to be referred to.

Hereinafter, preferred embodiments of the present disclosure are described in detail with reference to the accompanying drawings. The same reference numerals among the reference numerals in each drawing indicate the same members.

Figure 3:
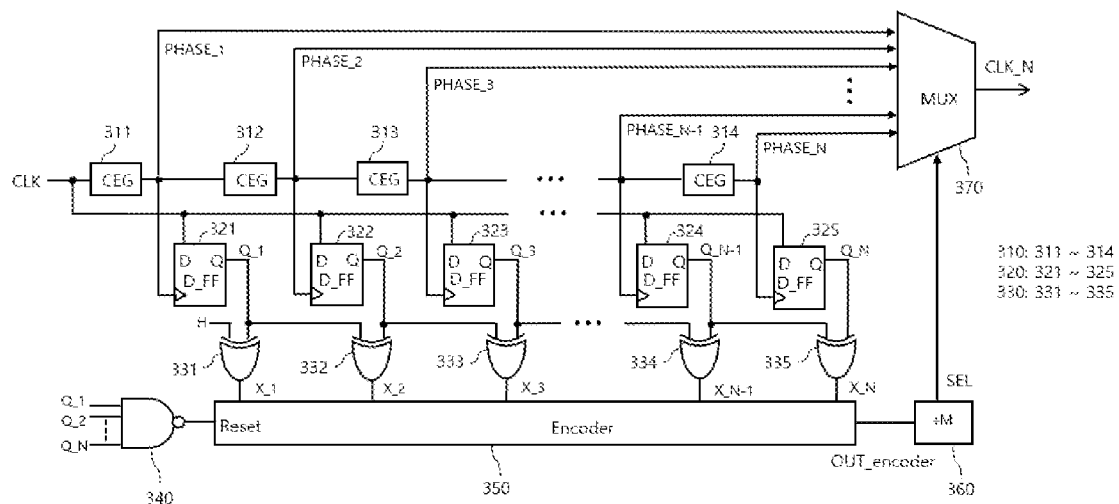
FIG. 3 illustrates an example of a clock phase converter according to the present disclosure.

FIG. 3 illustrates an example of a clock phase converter 300 according to the present disclosure.

Referring to FIG. 3, the clock phase converter 300 according to the present disclosure includes a delayed clock signal generation unit 310, a delayed clock signal storage unit 320, a delayed clock signal first logic combination unit 330, a delayed clock signal second logic combination unit 340, an encoder 350, a divider 360, and a multiplexer 370.

The delayed clock signal generation unit 310 includes a plurality of delayed clock signal generators 311 to 315 connected in series, and generates a plurality of delayed clock signals PHASE_1 to PHASE_N by sequentially delaying a clock signal CLK input to the delayed clock signal generator 311 at the foremost stage among the plurality of delayed clock signal generators connected in series.

Figure 4:
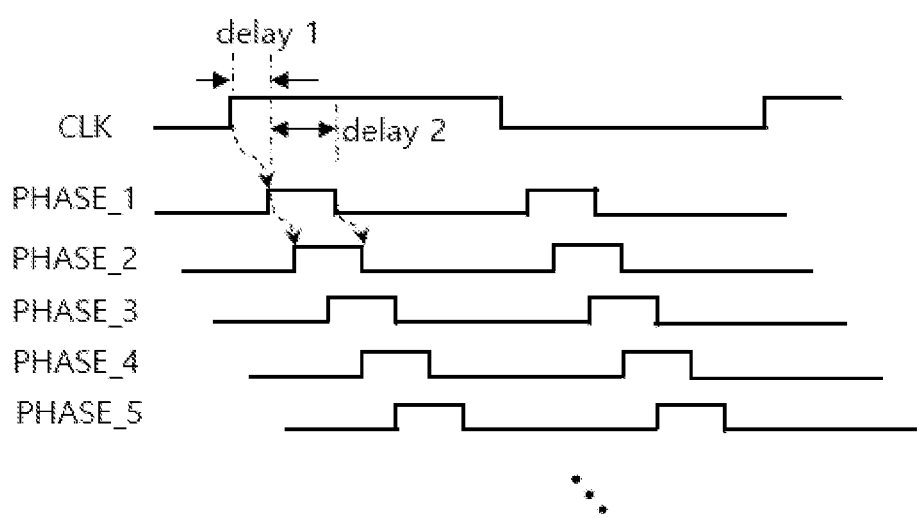
FIG. 4 illustrates an example of a plurality of delayed clock signals generated by a delayed clock signal generation unit.

FIG. 4 illustrates an example of the plurality of delayed clock signals generated by the delayed clock signal generation unit.

The delayed clock signal generators 311 to 314 generate the plurality of delayed clock signals PHASE_1 to PHASE_N, respectively, but for convenience of description, FIG. 4 illustrates only five delayed clock signals PHASE_1 to PHASE_5.

Referring to FIGS. 3 and 4, a first delayed clock signal generator 311 detects a rising edge of the clock signal CLK, and a level (logic high) of a first delayed clock signal PHASE_1 rises after a first delay time delay 1 elapses and falls from a logic high state to a logic low state after a second delay time delay 2 elapses from the time the first delayed clock signal PHASE_1 rises to a logic high value. It can be seen that a second delayed clock signal generator 312 generates a second delayed clock signal PHASE_2 in response to the first delayed clock signal PHASE_1 of the first delayed clock signal generator 311, and the plurality of subsequent delayed clock signal generators 313 to 314 also generate the plurality of delayed clock signals PHASE_3 to PHASE_5, respectively, by performing the same operation as the first delayed clock signal generator 311 and the second delayed clock signal generator 312 in response to a delayed clock signal output from a delayed clock signal generator of the previous stage.

The first delay time delay 1 and the second delay time delay 2 are changed depending on the configuration of each of the delayed clock signal generators 311 to 315 and are described below.

Referring to FIG. 3, the first delayed clock signal generator 311 generates the first delayed clock signal PHASE_1, the second delayed clock signal generator 312 generates the second delayed clock signal PHASE_2, the third delayed clock signal generator 313 generates a third delayed clock signal PHASE_3, and finally, the $N^{th}$ (N is a natural number) delayed clock signal generator 314 generates an $N^{th}$ delayed clock signal PHASE_N.

Referring again to FIG. 3, the delayed clock signal storage unit 320 includes a plurality of D-type flip-flops 321 to 325 that receive, store, and output the clock signal CLK in response to a corresponding delayed clock signal among the plurality of delayed clock signals PHASE_1 to PHASE_N. For example, a first D-type flip-flop 321 outputs the clock signal CLK applied to an input terminal D thereof as a first storage clock signal Q_1 through a positive output terminal Q thereof in response to the first delayed clock signal PHASE_1. A second D-type flip-flop 322 outputs the clock signal CLK applied to an input terminal D thereof as a second storage clock signal Q_2 through a positive output terminal Q thereof in response to the second delayed clock signal PHASE_2. Since the operations of the remaining D-type flip-flops 323 to 325 are the same as the connection relationship between the first D-type flip-flop 321 and the second D-type flip-flop 322, detailed description thereof is omitted.

The operation of the delayed clock signal storage unit 320 is briefly described. Whenever the plurality of delayed clock signals PHASE_1 to PHASE_N sequentially toggle, the corresponding D-type flip-flop 321 to 325 output the logic values of the clock signal CLK through the positive output terminals Q thereof, and store the logic values of the clock signals CLK, which are simultaneously output, for a certain period of time.

The delayed clock signal first logic combination unit 330 includes a plurality of EX_ORs 331 to 335 that perform EXclusive ORing on the signals output from the positive output terminals Q of the D-type flip-flops 321 to 325 in response to a logic high value H and a plurality of storage clock signals Q_1 to Q_N. The EX_OR refers to a circuit that outputs a logic low value 'L' when two input signals are equal to each other and outputs a logic high value 'H' when the two input signals are different from each other, and is also referred to as an XOR gate.

A first EX_OR 331 performs EXclusive ORing on the logic high value H and the first storage clock signal Q_1 applied from the outside. When the first storage clock signal Q_1 is in a logic low state, the first EX_OR 331 outputs a logic high value, and when the first storage clock signal Q_1 is in a logic high state, the first EX_OR 331 outputs a logic low value. A second EX_OR 332 performs EXclusive ORing on the first storage clock signal Q_1 and the second storage clock signal Q_2. The remaining EX_ORs 333 to 335 also perform EXclusive ORing on two consecutive storage clock signals.

For example, when the first storage clock signal Q_1 and the second storage clock signal Q_2 to a fourth storage clock signal Q_4 are in a logic high state, the first EX_OR 331 to the fourth EX_OR output a logic low state as a first exclusive OR signal X_1 to a fourth exclusive OR signal X_4. As will be described below, in the present disclosure, a plurality of storage clock signals having a logic low value are counted and used.

The delayed clock signal second logic combination unit 340 may include a NAND gate 340 that generates a reset signal Reset by inverting a value obtained by ANDing the plurality of storage clock signals Q_1 to Q_N output from the delayed clock signal storage unit 320. The NAND gate 340 refers to a logic circuit that has a logic low value when all the plurality of storage clock signals Q_1 to Q_N applied are in a logic high state and outputs a logic high value when at least one of the plurality of storage clock signals Q_1 to Q_N is in a logic low state.

The encoder 350 is initialized in response to the reset signal Reset received from the delayed clock signal second logic combination unit 340, and generates an encoding output signal OUT_encoder that is the result of counting the logic states of the plurality of exclusive OR signal X_1 to X_N output from the delayed clock signal first logic combination unit 330. For convenience of description, it is assumed that the encoder 350 encodes the number of logic low states among the logic states of the plurality of exclusive OR signals X_1 to X_N.

For example, when the plurality of exclusive OR signals X_1 to X_N are sequentially arranged in the direction from X_1 to X_N and have a value of 000000001, since the first to eighth exclusive OR signals have a logic low value and the ninth exclusive OR signal X_9 has a logic high value, the encoder 350 counts the result of the plurality of exclusive OR signals X_1 to X_N as 8 and generates, as the encoding output signal OUT_encoder, 1000 that is the binary representation of 8.

The reason for counting only 8 of the 9 exclusive OR signals with a logic low value is described below.

The divider 360 outputs, as a selection signal SEL, a value obtained by dividing the encoding output signal OUT_encoder by a preset divide value M. When M is set to 2, 100, which is a value determined by dividing the encoded output signal OUT_encoder with a value of 1000 by 2, is the selection signal SEL. The binary number 1000 is 8 when expressed as a decimal number, and the binary number 100 is 4 when expressed as a decimal number.

The divide value M is a value that may be arbitrarily selected, and determines a delay value of a clock signal to be selected as needed.

The multiplexer 370 selects one delayed clock signal among the plurality of delayed clock signals PHASE_1 to PHASE_N output from the delayed clock signal generation unit 310 according to the selection signal SEL, and outputs the selected delayed clock signal as a selected delayed clock signal CLK_N.

Figure 5:
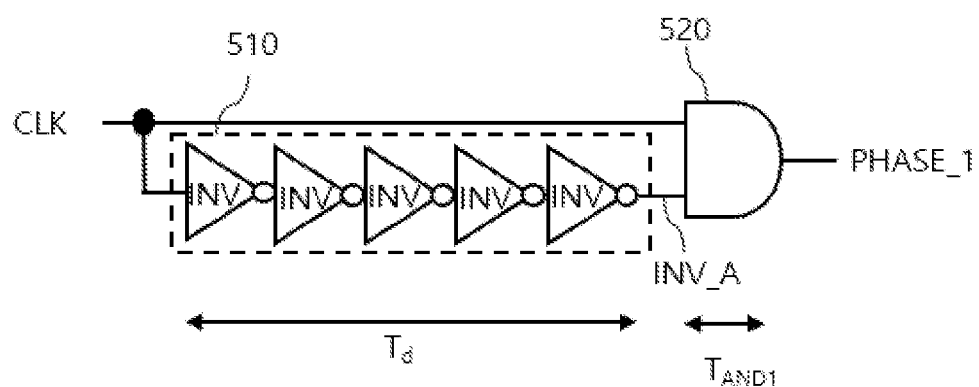
FIG. 5 illustrates a first example of one delayed clock signal generator among a plurality of delayed clock signal generators constituting the delayed clock signal generation unit.

FIG. 5 illustrates a first example of one delayed clock signal generator among the plurality of delayed clock signal generators constituting the delayed clock signal generation unit.

Referring to FIG. 5, the delayed clock signal generator 311 according to the present disclosure includes a first delay section 510 and a first AND gate 520.

The first delay section 510 is an inverter array in which a plurality of inverters INV are connected in series, and a clock signal CLK is applied to an input terminal of the inverter array. The inverter array includes an odd number of inverters INV connected in series, receives the clock signal CLK, and then generates an inverse clock signal INV_A having the same magnitude and opposite phase as the clock signal CLK after the total delay time Td. The total delay time Td is the sum of response delay times of the inverters INV.

The first AND gate 520 generates the first delayed clock signal PHASE_1 by ANDing the clock signal CLK and the inverse clock signal INV_A. In FIG. 5, $T_{AND1}$ refers to the response delay time of the first AND gate 520.

Although one delayed clock signal generator is illustrated and described in FIG. 5, the remaining delayed clock signal generators may also have the same configuration.

Figure 6:
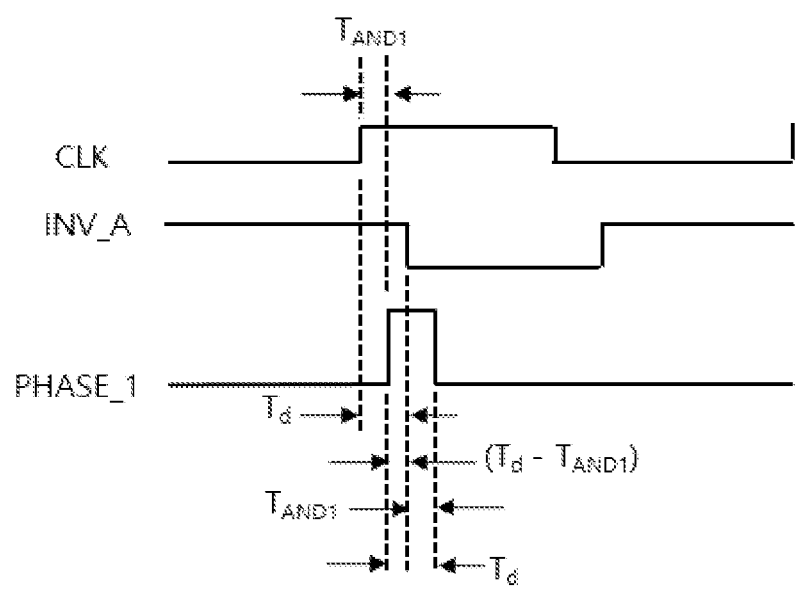
FIG. 6 illustrates a signal diagram related to the delayed clock signal generator illustrated in FIG. 5.

FIG. 6 illustrates a signal diagram related to the delayed clock signal generator illustrated in FIG. 5.

Referring to FIG. 6, in the delayed clock signal generator 311, after the clock signal CLK transitions from a logic low state to a logic high state, the first delayed clock signal PHASE_1 transitions again from a logic low state to a logic high state after the delay time $T_{AND1}$ of the first AND gate 520 elapses.

It can be seen that the delay time $T_{AND1}$ of the first AND gate 520 is a delay time caused by the signal transmission time of elements constituting the first AND gate 520, and the two input signals CLK and INV_A of the first AND gate 520 are all in a logic high state, but the first delayed clock signal PHASE_1 changes from a logic low state to a logic high state only after the delay time $T_{AND1}$ elapses.

The first delayed clock signal PHASE_1, which maintains the logic high state, transitions to a logic low state after the delay time $T_{AND1}$ elapses from when the inverse clock signal INV_A transitions to a logic low state again.

Referring to FIG. 6, it can be seen that when the total delay time Td elapses after the clock signal CLK is received, the logic state of the inverse clock signal INV_A, which has the same magnitude and opposite phase as the clock signal CLK, transitions.

Since the width of the first delayed clock signal PHASE_1 is $(Td-T_{AND1})+T_{AND1}$, it eventually becomes Td. In the following drawings and descriptions, the width of the delayed clock signal PHASE is denoted and expressed as Td.

Figure 7:
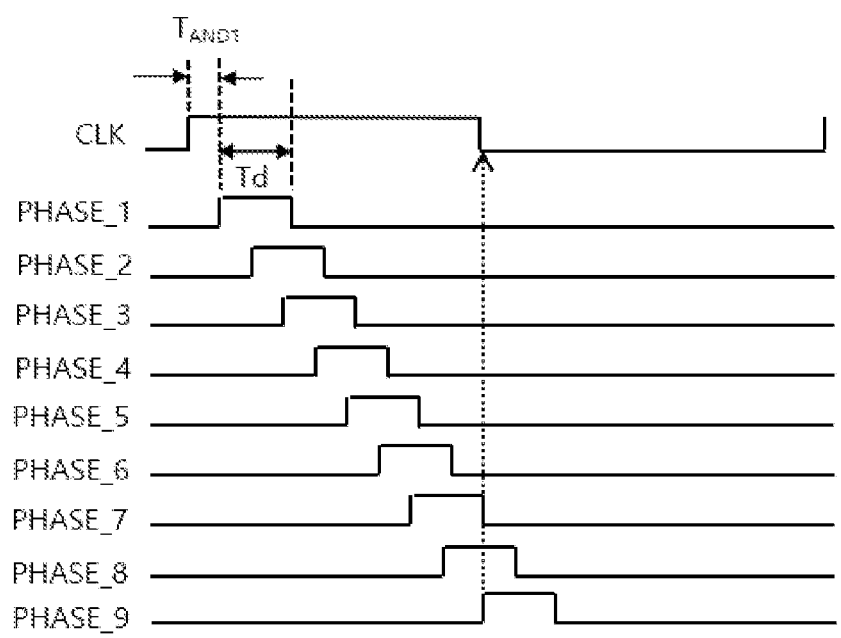
FIG. 7 illustrates a signal diagram related to the plurality of delayed clock signal generators illustrated in FIG. 5.

FIG. 7 illustrates a signal diagram related to the plurality of delayed clock signal generators illustrated in FIG. 5.

Referring to FIG. 7, when it is assumed that there are 9 delayed clock signal generators, it can be seen that the delayed clock signals PHASE_1 to PHASE_8 output from the previous 8 delayed clock signal generators transition in a half cycle of the clock signal CLK, that is, a period in which a logic high state is maintained, but the delayed clock signal PHASE_9 output from the ninth delayed clock signal generator transitions at the moment the clock signal CLK transitions from a logic high state to a logic low state or when the clock signal CLK is in a logic low state instead of transitioning when the clock signal CLK is in a logic high state.

As described above, the delayed clock signal first logic combination unit 330 performs EXclusive ORing on the plurality of delayed clock signals.

The description of FIG. 7 may be applied as is to examples of FIGS. 9, 10, and 13 in the following description.

Figure 8:
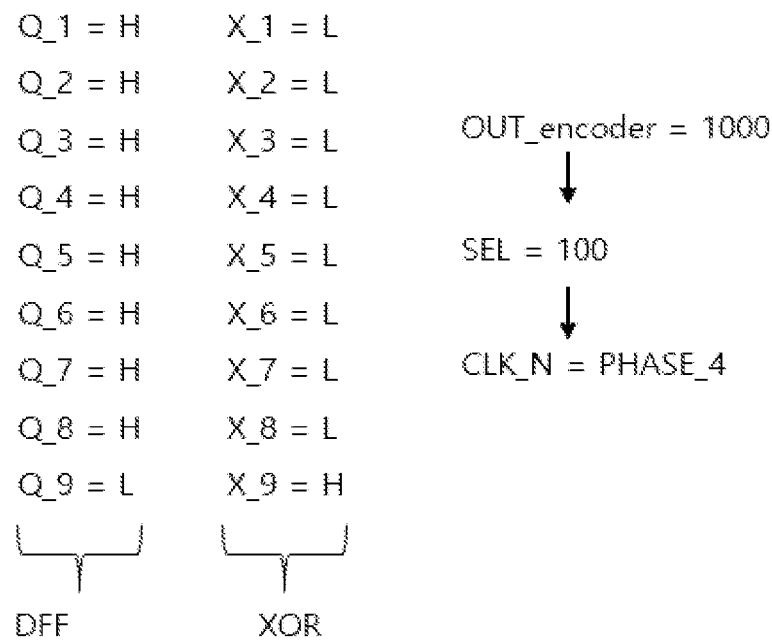
FIG. 8 illustrates logic states and binary values when EXclusive ORing is performed in a delayed clock signal first logic combination unit, an encoder, a divider, and a multiplexer.

FIG. 8 illustrates logic states and binary values when EXclusive ORing is performed in the delayed clock signal first logic combination unit, the encoder, the divider, and the multiplexer.

FIG. 8 illustrates nine storage clock signals Q_1 to Q_9 applied to the delayed clock signal first logic combination unit 330, nine exclusive OR signals X_1 to X_9 output from the delayed clock signal first logic combination unit 330, the encoding output signal OUT_encoder output from the encoder 350, the selection signal SEL output from the divider 360, and the selected delayed clock signal CLK_N selected by and output from the multiplexer 370.

Since the previous eight storage clock signals Q_1 to Q_8 each have a logic high state and the ninth delayed clock signal Q_9 has a logic low state, the eight exclusive OR signals X_1 to X_8 each have a logic low state and the ninth exclusive OR signal X_9 has a logic high state. The encoder 350 counts only the eight exclusive OR signals X_1 to X_8 each having a logic low state among the nine exclusive OR signals X_1 to X_9, and this is because the ninth delayed clock signal PHASE_9 transitions in a period in which the clock signal CLK is not in a logic high state as illustrated in FIG. 7.

This assumes that, in the case of the examples illustrated in FIGS. 5 to 8, the phase shift of the delayed clock signal PHASE is selected to occur only during a half cycle of the clock signal CLK.

Accordingly, the encoder 350 outputs an encoding output signal OUT_encoder having a value of 1000 in binary, the divider 360 with the divide value M set to 2 outputs, as the selection signal SEL, a binary number 100 obtained by dividing the encoding output signal OUT_encoder by 2, and the multiplexer 370 outputs the second delayed clock signal PHASE_4 as the selected delay signal CLK_N in response to the selection signal SEL.

Since the selected delay signal CLK_N is eventually determined by the divide value M set by a user, the user may generate a delayed clock signal with a desired delay time by setting a divide value corresponding to a desired delay time.

Figure 9:
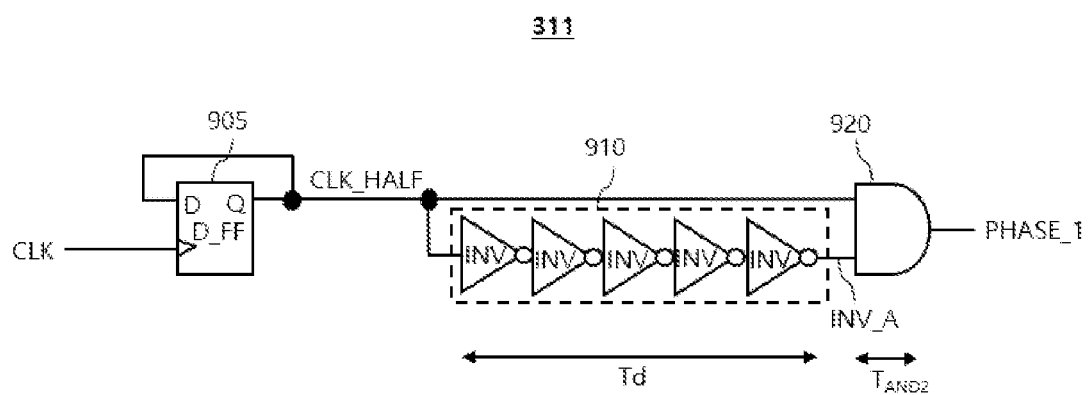
FIG. 9 illustrates a second example of one delayed clock signal generator among the plurality of delayed clock signal generators constituting the delayed clock signal generation unit.

FIG. 9 illustrates a second example of one delayed clock signal generator among the plurality of delayed clock signal generators constituting the delayed clock signal generation unit.

Referring to FIG. 9, the delayed clock signal generator 311 according to the present disclosure includes a clock division section 905, a second delay section 910, and a second AND gate 920.

The clock division section 905 generates a divided clock signal CLK_HALF by dividing the frequency of the clock signal CLK by ½. The clock division section 905 may operate in response to, for example, the clock signal CLK, and may be implemented by one D-type flip-flop 905 in which an input terminal is connected to a positive terminal Q that outputs the divided clock signal CLK_HALF.

Since the second delay section 910 and the second AND gate 920 are the same as the first delay section 510 and the first AND gate 520 illustrated in FIG. 5, the aforementioned description on the first delay section 510 and the first AND gate 520 illustrated in FIG. 5 is applied to the second delay section 910 and the second AND gate 920.

The example of FIG. 9 is different from the example of FIG. 5 in which the clock signal CLK is used as is in that the divided clock signal CLK_HALF obtained by dividing the clock signal CLK by ½ is used in FIG. 9, and the other configurations and operating characteristics are the same.

Although one delayed clock signal generator is illustrated and described in FIG. 9, the remaining delayed clock signal generators may also have the same configuration.

Referring to the delayed clock signal generator illustrated in FIG. 5 and FIG. 7 for the signal diagram of the delayed clock signal generator illustrated in FIG. 5, in the case of the delayed clock signal generator illustrated in FIG. 9, since a delayed clock signal may be used for one cycle of the clock signal CLK rather than a half cycle of the clock signal CLK, it can be easily predicted that twice the number of delayed clock signals may be used compared to the example illustrated in FIG. 5.

An increase in the number of delayed clock signals means that the user may set the divider value M more broadly. For example, in the case of FIG. 5, M is preferably 2 or 4, while in the case of FIG. 9, the odd number 3 can be selected in addition to the even numbers 2 and 4.

Figure 10:
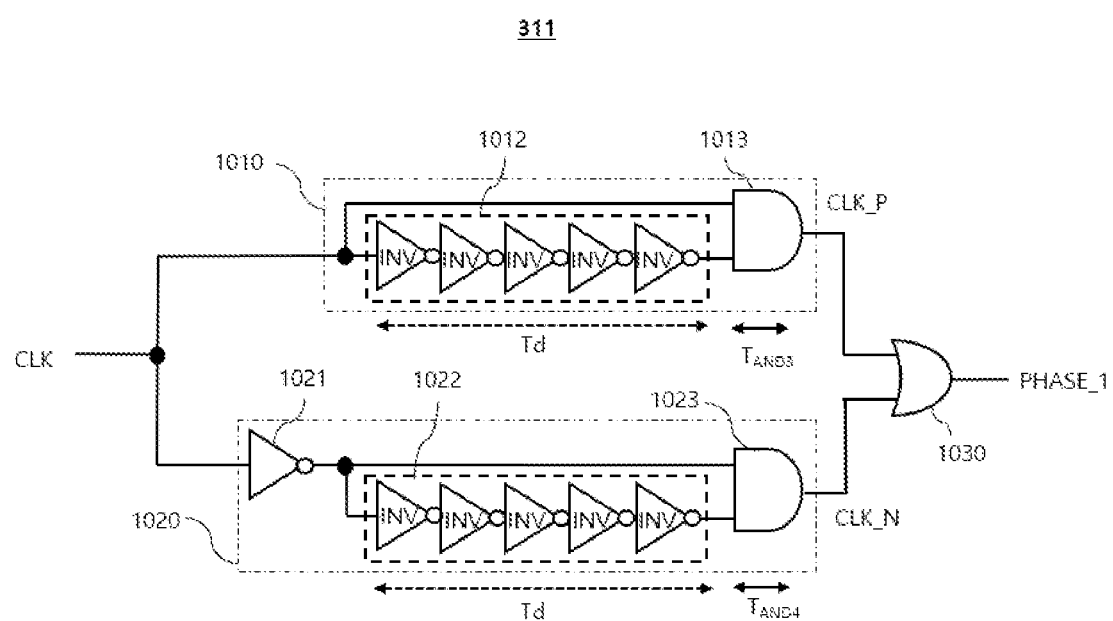
FIG. 10 illustrates a third example of one delayed clock signal generator among the plurality of delayed clock signal generators constituting the delayed clock signal generation unit.

FIG. 10 illustrates a third example of one delayed clock signal generator among the plurality of delayed clock signal generators constituting the delayed clock signal generation unit.

Referring to FIG. 10, the delayed clock signal generator 311 according to the present disclosure includes a first half-cycle delayed clock generation circuit 1010, a second half-cycle delayed clock generation circuit 1020, and a first OR circuit 1030.

The first half-cycle delayed clock generation circuit 1010 and the second half-cycle delayed clock generation circuit 1020 generate a plurality of delayed clock signals that are activated in a high level (positive level) period or a low level (negative level) period in response to one of a rising edge and a falling edge of the clock signal CLK, respectively.

The first half-cycle delayed clock generation circuit 1010 is the same as the delayed clock signal generation unit illustrated in FIG. 5, and the second half-cycle delayed clock generation circuit 1020 is different from the delayed clock signal generation unit illustrated in FIG. 5 in that an inverter 1021 for inverting the phase of the clock signal CLK and applying the clock signal is additionally included in the delayed clock signal generation unit illustrated in FIG. 5.

The first OR circuit 1030 may be implemented by a NOR gate 1030 that generates the first delayed clock signal PHASE_1 by ORing signals (a first half-cycle delayed clock signal and a second half-cycle delayed delay clock) output from the first half-cycle delayed clock generation circuit 1010 and the second half-cycle delayed clock generation circuit 1020.

The operations of the first half-cycle delayed clock generation circuit 1010 and the second half-cycle delayed clock generation circuit 1020 are described with reference to FIG. 11.

Figure 11:
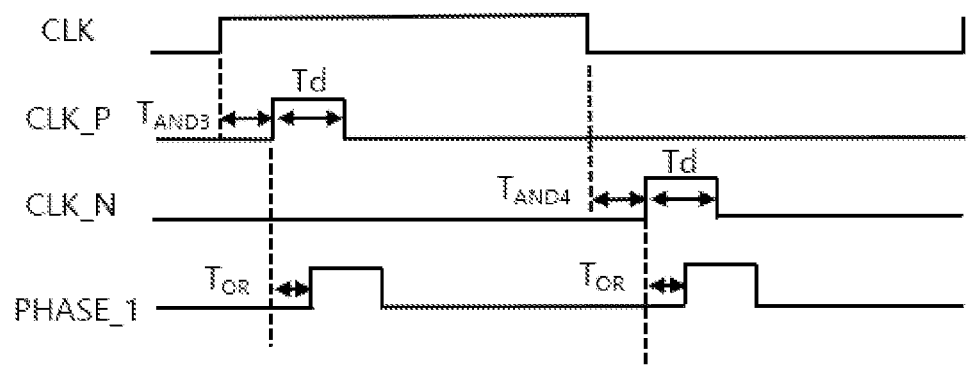
FIG. 11 illustrates a signal diagram related to the delayed clock signal generator illustrated in FIG. 10.

FIG. 11 illustrates a signal diagram related to the delayed clock signal generator illustrated in FIG. 10.

Referring to FIG. 11, after a delay time $T_{AND3}$ of a third AND gate 1013 constituting the first half-cycle delayed clock generation circuit 1010 from the moment the clock signal CLK in a low level state transitions to a high level, a first delayed clock signal CLK_P in a positive period generates a pulse having the width of the delay time Td.

After a delay time $T_{AND4}$ of a fourth AND gate 1014 constituting the second half-cycle delayed clock generation circuit 1020 from the moment the clock signal CLK in a high level state transitions to a low level, a first delayed clock signal CLK_N in a negative period generates a pulse having the period of the delay time Td.

The NOR gate 1030 implementing the first OR circuit generates the first delayed clock signal PHASE_1 in response to the first delayed clock signal CLK_P in a positive period output from the first half-cycle delayed clock generation circuit 1010 and the first delayed clock signal CLK_N in a negative period output from the second half-cycle delayed clock generation circuit 1020, after a response delay time $T_{OR}$ of the NOR gate 1030 itself elapses.

Figure 12:
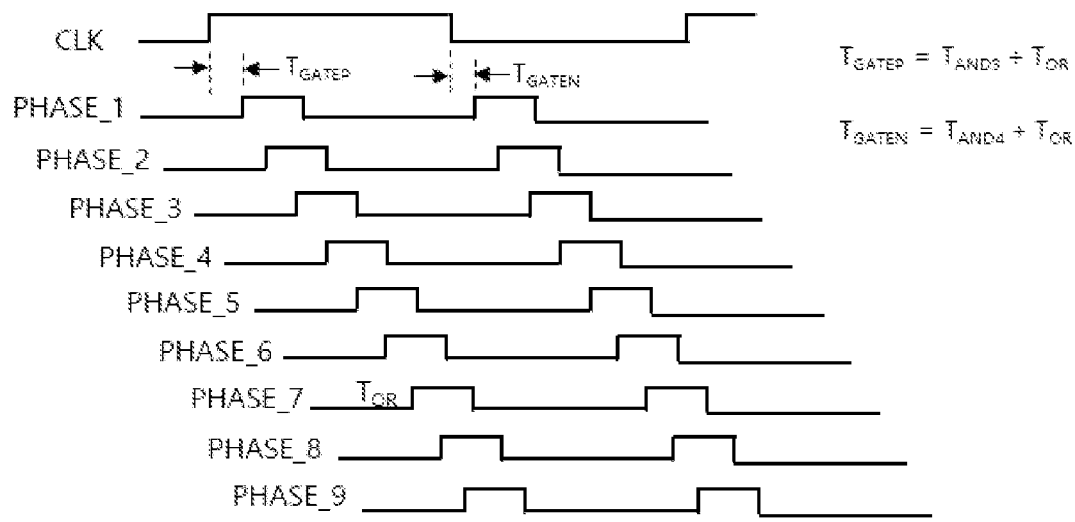
FIG. 12 illustrates a signal diagram related to the plurality of delayed clock signal generators illustrated in FIG. 10.

FIG. 12 illustrates a signal diagram related to the plurality of delayed clock signal generators illustrated in FIG. 10.

Referring to FIG. 12, since each delayed clock signal PHASE includes two pulses during one cycle of the clock signal CLK, it can be seen that the cycle of each delayed clock signal PHASE is ½ times that of the clock signal CLK, that is, the frequency is doubled.

That is, it can be seen that a signal with a frequency twice that of the clock signal CLK may be generated and the phase may be adjusted at the same time in the third example illustrated in FIG. 10.

Figure 13:
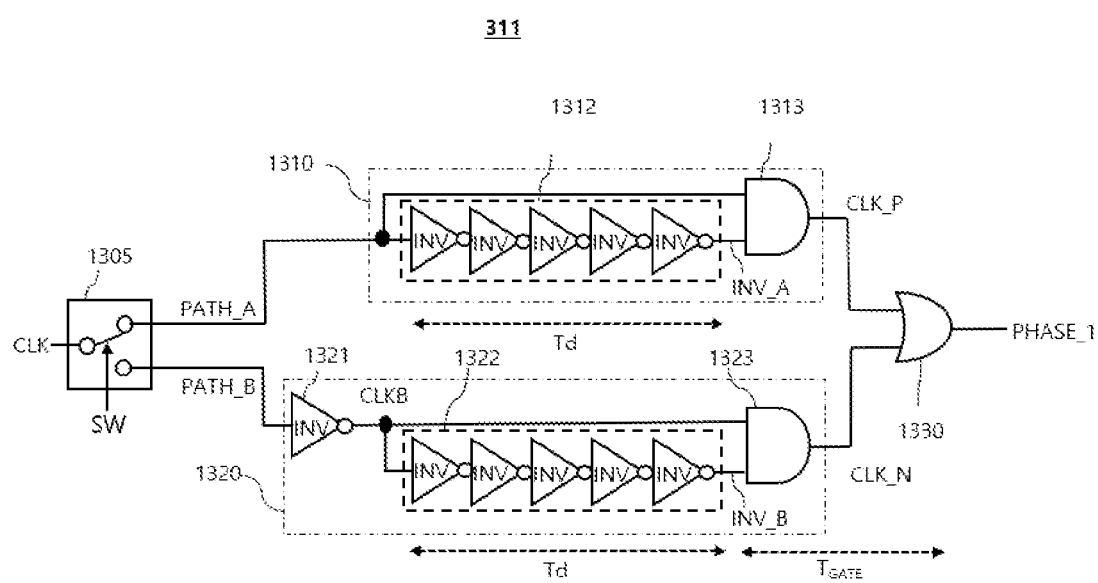
FIG. 13 illustrates a fourth example of one delayed clock signal generator among the plurality of delayed clock signal generators constituting the delayed clock signal generation unit.

FIG. 13 illustrates a fourth example of one delayed clock signal generator among the plurality of delayed clock signal generators constituting the delayed clock signal generation unit.

Referring to FIG. 13, the fourth example is different from the third example illustrated in FIG. 10 in that the fourth example further includes a clock signal path selector 1305 that selects and transmits the clock signal CLK to one of two paths PATH_A and PATH_B or a multiplexer, and the others are the same.

However, in order to avoid confusion with the circuit illustrated in FIG. 10, the following description is given on the assumption that a delayed clock generation circuit of a path A PATH_A illustrated in FIG. 13 is a A-path delayed clock generation circuit 1310 and a delayed clock generation circuit of a path B PATH_B is a B-path delayed clock generation circuit 1320.

A period in which the delayed clock signal PHASE generated is activated may vary depending on the transmission path of the clock signal CLK selected by the clock signal path selector 1305.

For convenience of description, the response delay times of AND gates 1313 and 1323 and an OR gate 1330 are added up and named $T_{GATE}$.

Figure 14:
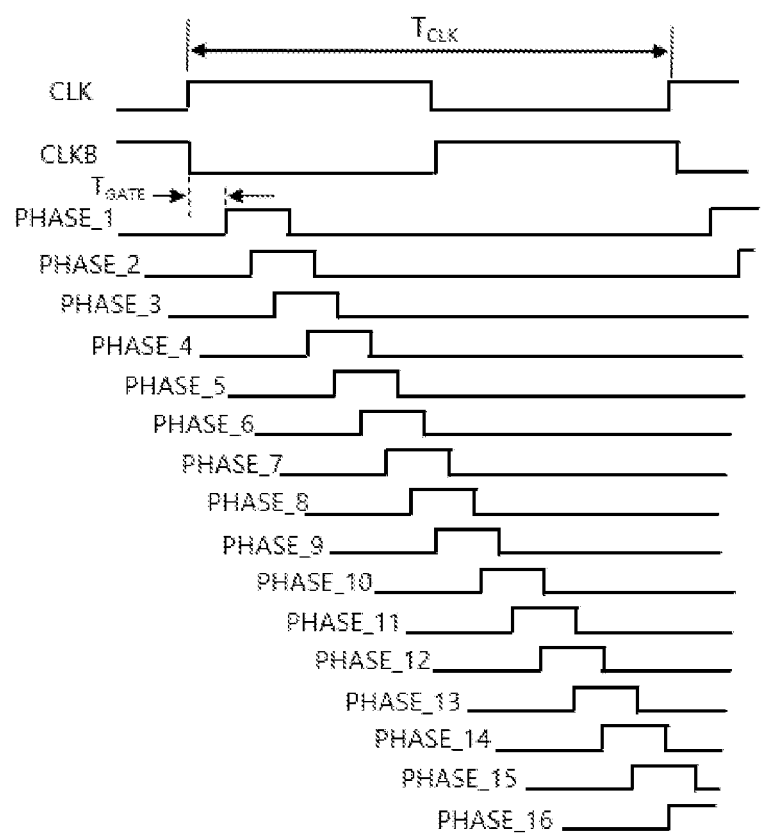
FIG. 14 illustrates a signal diagram related to the plurality of delayed clock signal generators when a clock signal path selector illustrated in FIG. 13 selects a path A PATH_A.

FIG. 14 illustrates a signal diagram related to the plurality of delayed clock signal generators when the clock signal path selector illustrated in FIG. 13 selects the path A PATH_A.

Figure 15:
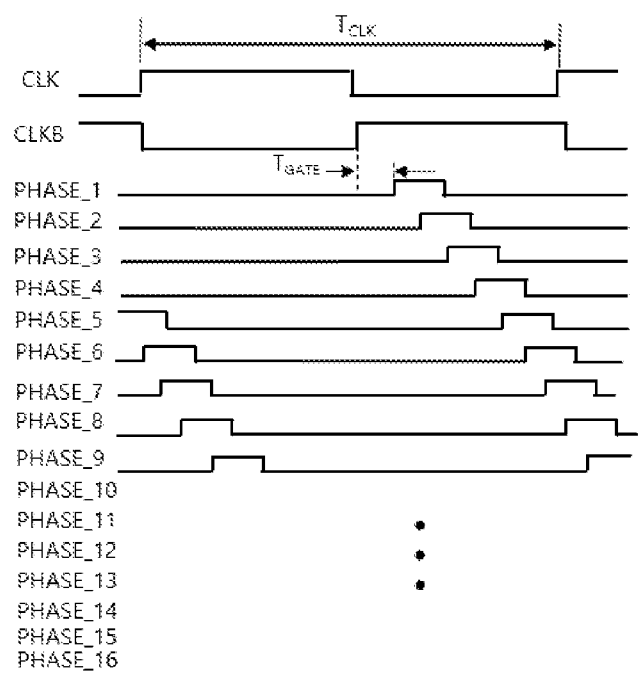
FIG. 15 illustrates a signal diagram related to the plurality of delayed clock signal generators when the clock signal path selector illustrated in FIG. 13 selects a path B PATH_B.

FIG. 15 illustrates a signal diagram related to the plurality of delayed clock signal generators when the clock signal path selector illustrated in FIG. 13 selects the path B PATH_B.

Referring to FIG. 14, when the clock signal path selector selects the path A PATH_A, it can be seen that the plurality of delayed clock signals PHASE_1 to PHASE_16 are activated from a period in which the clock signal CLK transitions from logic low (low level) to logic high (high level).

Referring to FIG. 15, when the clock signal path selector selects the path A PATH_A, it can be seen that the plurality of delayed clock signals PHASE_1 to PHASE_16 are activated from a period in which the clock signal CLK transitions from logic high to logic low.

In the above description, the first delay time delay 1 refers to the total response delay time of each or a combination of the logic gate circuits 520, 920, 1013, 1023, 1030, 1313, 1323, and 1330, and the second delay time delay 2 refers to the sum of the response delay times of a plurality of inverters INV each constituting the inverter array 510, 910, 1012, 1022, 1310, and 1320.

Although the delayed clock signal generation unit 310 of the present disclosure has been illustrated and described to include a total of 16 stages and generate 16 delayed clock signals PHASE_1 to PHASE_16, this is for ease of understanding and the number of stages and the size of the delay component of the delayed clock signal generation unit 310 can be arbitrarily adjusted.

Using the clock phase converter 300 illustrated in FIG. 3, the phase and frequency of the clock signal can be converted in the following manner. Each step to be described below is performed in each functional block constituting the clock phase converter 300 illustrated in FIG. 3, and the execution process and execution method can be easily understood by referring to the contents described above.

Figure 16:
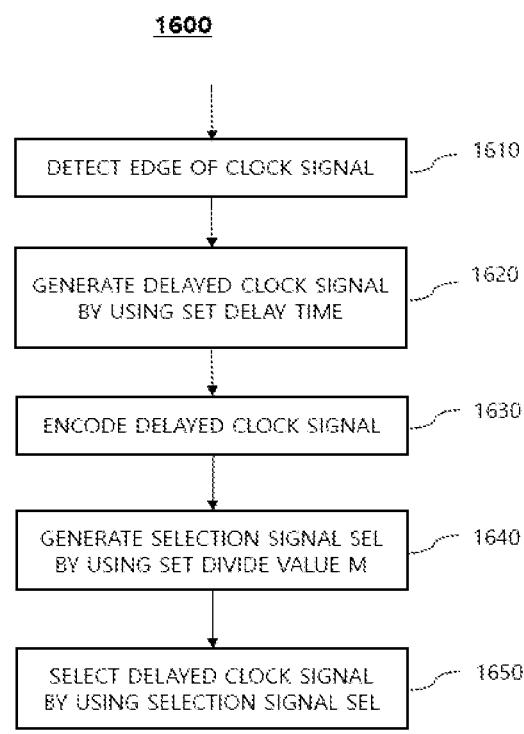
FIG. 16 is an example of a phase converting method according to the present disclosure.

FIG. 16 is an example of a phase converting method according to the present disclosure.

Referring to FIG. 16, a phase converting method 1600 according to the present disclosure includes a step 1610 of detecting the edge of the clock signal CLK, a step 1620 of generating a plurality of delayed clock signals sequentially delayed by using a preset delay time, a step 1630 of encoding the number of states selected from the states of the plurality of delayed clock signals, a step 1640 of generating, as a selection signal SEL, a value (quotient) obtained by dividing an encoded value by a preset divide value M, and a step 1650 of selecting and outputting a delayed clock signal corresponding to the selection signal SEL among the plurality of delayed clock signals.

The method illustrated in FIG. 16 operates corresponding to the examples illustrated in FIGS. 5, 9 and 10.

Figure 17:
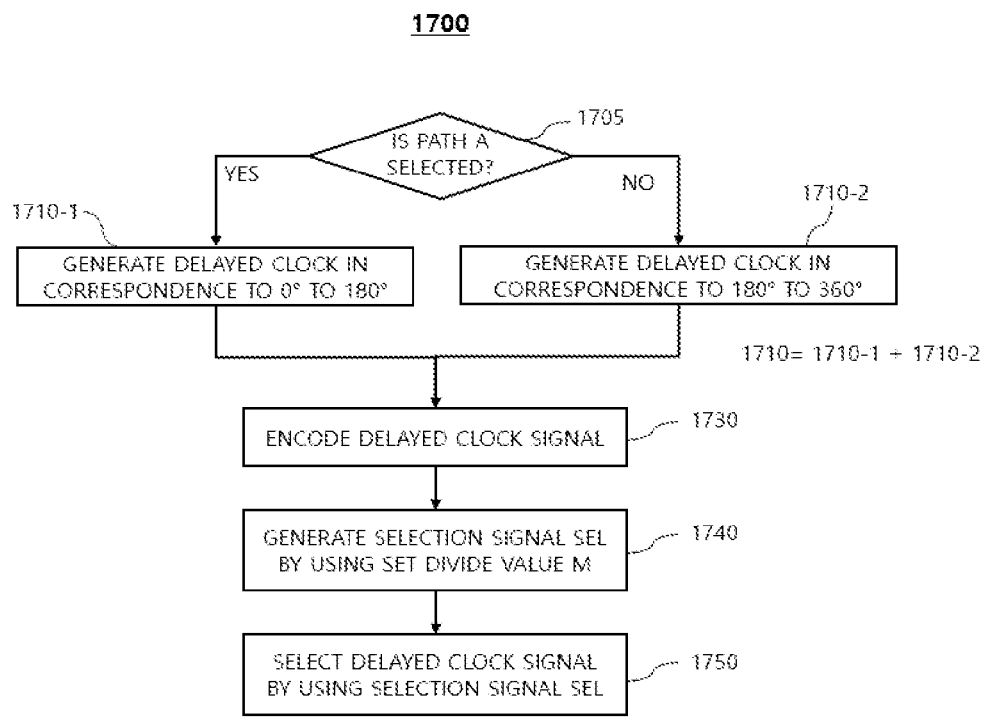
FIG. 17 is another example of a phase converting method according to the present disclosure.

FIG. 17 is another example of the phase converting method according to the present disclosure.

Referring to FIG. 17, a phase converting method 1700 according to the present disclosure may also convert the phase and frequency of a delayed clock signal generated, and includes a step 1705 of selecting a path, a step 1710-1 of generating a plurality of delayed clock signals sequentially delayed by using a preset delay time in correspondence to 0° to 180° of the clock signal CLK when a path A is selected (YES in 1705), a step 1710-2 of generating a plurality of delayed clock signals sequentially delayed by using a preset delay time in correspondence to 180° to 360° of the clock signal CLK when a path B is selected (NO in 1705), a step 1730 of encoding the number of states selected from the states of the delayed clock signals generated in the previous two steps 1710-1 and 1710-2, a step 1740 of generating, as a selection signal SEL, a value (quotient) obtained by dividing an encoded value by a preset divide value M, and a step 1750 of selecting and outputting a delayed clock signal corresponding to the selection signal SEL among the plurality of delayed clock signals.

The method illustrated in FIG. 17 operates corresponding to the example illustrated in FIG. 13.

What is claimed is:

1. A clock phase converter comprising:
   a delayed clock signal generation unit configured to generate a plurality of delayed clock signals by converting a phase of a clock signal or the phase and a frequency of the clock signal;
   a delayed clock signal storage unit configured to receive, store, and output the clock signal in response to a corresponding delayed clock signal among the plurality of delayed clock signals;
   a delayed clock signal first logic combination unit configured to generate a plurality of exclusive OR signals by performing EXclusive ORing on a logic high signal and a plurality of storage clock signals stored in the delayed clock signal storage unit;
   an encoder configured to generate an encoding output signal by counting logic states of the plurality of exclusive OR signals;
   a divider configured to output, as a selection signal, a value obtained by dividing a preset divide value by the encoding output signal; and
   a multiplexer configured to output a selected delayed clock signal, selected in response to the selection signal, among the plurality of delayed clock signals.

2. The clock phase converter of claim 1, further comprising:
   a delayed clock signal second logic combination unit configured to generate a reset signal in response to the plurality of storage clock signals,
   wherein the encoder is configured to reset the encoder in response to the reset signal.

3. The clock phase converter of claim 1, wherein the delayed clock signal generation unit includes a plurality of delayed clock signal generators connected in series, and is configured to generate the plurality of delayed clock signals by sequentially delaying the clock signal, which is input to a delayed clock signal generator at the foremost stage among the plurality of delayed clock signal generators connected in series, by using a preset delay time.

4. The clock phase converter of claim 3, wherein the delayed clock signal generator comprises:
   a first delay section including a plurality of inverters connected in series and configured to receive the clock signal through an input terminal of an inverter located at the foremost stage and to generate an inverse clock signal with a phase opposite to the phase of the clock signal from an output terminal of an inverter located at the last stage; and
   a first AND gate configured to generate the delayed clock signal by ANDing the clock signal and the inverse clock signal.

5. The clock phase converter of claim 3, wherein the delayed clock signal generator comprises:
   a clock division section configured to generate a divided clock signal by dividing the frequency of the clock signal;
   a second delay section including a plurality of inverters connected in series and configured to receive the divided clock signal through an input terminal of an inverter located at the foremost stage and to generate a divided inverse clock signal with a phase opposite to a phase of the divided clock signal from an output terminal of an inverter located at the last stage; and
   a second AND gate configured to generate the delayed clock signal by ANDing the divided clock signal and the divided inverse clock signal.

6. The clock phase converter of claim 3, wherein the delayed clock signal generator comprises:
   a first half-cycle delayed clock generation circuit configured to generate a plurality of first delayed clock signals in a positive period in response to a rising edge of the clock signal;
   a second half-cycle delayed clock generation circuit configured to generate a plurality of first delayed clock signals in a negative period in response to a falling edge of the clock signal; and a first OR circuit configured to generate the delayed clock signal by ORing the plurality of first delayed clock signals in the positive period and the plurality of first delayed clock signals in the negative period.

7. The clock phase converter of claim 6, wherein the first half-cycle delayed clock generation circuit comprises:
a third delay section including a plurality of inverters connected in series and configured to receive the clock signal through an input terminal of an inverter located at the foremost stage and to generate an inverse clock signal with a phase opposite to the phase of the clock signal from an output terminal of an inverter located at the last stage; and
a third AND gate configured to generate the plurality of first delayed clock signals in the positive period by ANDing the clock signal and the inverse clock signal,
the second half-cycle delayed clock generation circuit comprises:
an inverter configured to generate an inverse clock signal by inverting the phase of the clock signal;
a fourth delay section including a plurality of inverters connected in series and configured to receive the inverse clock signal through an input terminal of an inverter located at the foremost stage and to generate an inverted clock signal with a phase opposite to the phase of the inverse clock signal from an output terminal of an inverter located at the last stage; and
a fourth AND gate configured to generate the plurality of first delayed clock signals in the negative period by ANDing the inverse clock signal and the inverted clock signal.

8. The clock phase converter of claim 7, wherein the delayed clock signal generator comprises:
a clock signal path selector configured to connect the clock signal to one of the first half-cycle delayed clock generation circuit and the second half-cycle delayed clock generation circuit in response to a switching control signal.

9. The clock phase converter of claim 1, wherein the delayed clock signal storage unit comprises:
a plurality of D-type flip flops configured to output a logic value of the clock signal to positive output terminals and simultaneously store the logic value of the clock signal whenever the corresponding delayed clock signal among the plurality of delayed clock signals toggles.

10. The clock phase converter of claim 9, wherein the delayed clock signal first logic combination unit comprises:
a plurality of exclusive OR means configured to generate the plurality of exclusive OR signals by performing EXclusive ORing on signals output from the positive output terminals of the D-type flip flops in response to a logic high value and the plurality of storage clock signals.

11. The clock phase converter of claim 1, wherein the encoder is configured to generate the encoding output signal by counting logic states of the plurality of exclusive OR signals in which the same logic state is consecutive among the logic states of the plurality of exclusive OR signals output from the delayed clock signal first logic combination unit.

12. A phase converting method performed by a clock phase converter including a delayed clock signal generation unit that is configured to generate a plurality of delayed clock signals by converting a phase of a clock signal or the phase and a frequency of the clock signal, the phase converting method comprising:
a step of detecting an edge of the clock signal;
a step of generating the plurality of delayed clock signals sequentially delayed by using a preset delay time;
a step of encoding the number of states selected from states of the plurality of delayed clock signals;
a step of generating, as a selection signal, a value (quotient) obtained by dividing an encoded value by a preset divide value; and
a step of selecting and outputting a delayed clock signal corresponding to the selection signal among the plurality of delayed clock signals.

13. A phase converting method performed by a clock phase converter including a delayed clock signal generation unit that is configured to generate a plurality of delayed clock signals by converting a phase of a clock signal or the phase and a frequency of the clock signal, and being able to convert a phase and a frequency of a delayed clock signal generated, the phase converting method comprising:
a step of selecting a path;
a step of generating a plurality of A-path delayed clock signals sequentially delayed by using a preset delay time in correspondence to 0° to 180° of the clock signal CLK when a path A is selected in the step of selecting a path;
a step of generating a plurality of B-path delayed clock signals sequentially delayed by using a preset delay time in correspondence to 180° to 360° of the clock signal CLK when a path B is selected in the step of selecting a path;
a step of encoding the number of states selected from states of the plurality of A-path delayed clock signals and the plurality of B-path delayed clock signals;
a step of generating, as a selection signal, a value (quotient) obtained by dividing an encoded value by a preset divide value; and
a step of selecting and outputting a delayed clock signal corresponding to the selection signal among the plurality of A-path delayed clock signals and the plurality of B-path delayed clock signals.

* * * * *